United States Patent
Chen

(10) Patent No.: US 7,404,723 B1
(45) Date of Patent: Jul. 29, 2008

(54) CARD CONNECTOR

(75) Inventor: Chih-Cheng Chen, Taoyuan Hsien (TW)

(73) Assignee: Speed Tech Corp., Taoyuan Hsien (TW)

( * ) Notice: Subject to any disclaimer, the term of this patent is extended or adjusted under 35 U.S.C. 154(b) by 0 days.

(21) Appl. No.: 11/853,511

(22) Filed: Sep. 11, 2007

(51) Int. Cl.
*H01R 13/62* (2006.01)

(52) U.S. Cl. ...................................... 439/159; 439/188

(58) Field of Classification Search ................. 439/326, 439/630, 159, 188
See application file for complete search history.

(56) References Cited

U.S. PATENT DOCUMENTS

| | | | |
|---|---|---|---|
| 6,719,577 B2 * | 4/2004 | Nogami | 439/188 |
| 6,761,572 B1 * | 7/2004 | Chou | 439/188 |
| 6,981,885 B2 * | 1/2006 | Oh | 439/159 |
| 7,037,125 B1 * | 5/2006 | Kuan et al. | 439/159 |
| 7,326,071 B1 * | 2/2008 | Ho et al. | 439/159 |
| 7,335,039 B2 * | 2/2008 | Wang | 439/159 |
| 7,335,044 B2 * | 2/2008 | Lai et al. | 439/326 |

\* cited by examiner

*Primary Examiner*—Khiem Nguyen
(74) *Attorney, Agent, or Firm*—J.C. Patents

(57) ABSTRACT

A card connector including a base, a housing, a terminal set, a first detecting conductive element, and a slidable unit is provided. The housing is disposed on the base, and defines a receiving space with the base. The terminal set is secured to a certain position of the base. The first detecting conductive element is engaged to the base, and has an end electrically connected to a circuit board. The slidable unit includes a sliding block and a second detecting conductive element. The second detecting conductive element is engaged in the sliding block. The second detecting conductive element includes a first contact portion exposing from the sliding block and being in contact with the housing. The first detecting conductive element is positioned on a moving path of the second detecting conductive element.

7 Claims, 9 Drawing Sheets

CARD CONNECTOR

BACKGROUND OF THE INVENTION

1. Field of the Invention

The present invention generally relates to connector, and particularly, to a card connector which is capable of detecting an electronic card being inserted therein or ejected therefrom.

2. Description of Related Art

In the current information exploding days, electronic communication has become indispensable from human's life. Electronic communication devices, such as mobile phones, are often used by people with others for transmitting information.

A conventional mobile phone usually includes a built-in subscriber identity module card (SIM card) and a card connector. The SIM card can be inserted in a card connector of the mobile phone for providing user's information. Some current electronic devices further provide memory card slots for providing operation function or expanding memory capability.

A typical conventional card connector usually includes a card ejecting mechanism, which is often a double push card ejecting mechanism that is also known as a push-push card ejecting mechanism. When such a card ejecting mechanism is firstly pressed to a certain position, the electronic card slides into the card connector, and when the card ejecting mechanism is secondly pressed, the electronic card is ejected out from the card connector by an elastic member of the card ejecting mechanism.

However, taking a SIM card as an example, when a user inserts a SIM card into a card connector of a mobile phone, it is not rare that the SIM card is unconsciously incompletely inserted in the card connector and is locked by the card ejecting mechanism or other mechanisms because of deficient design of the card ejecting mechanism or improper operation. This is more often happened to those hot plug and play electronic cards, in that the user may misjudge a failure of the electronic device or the electronic card. In another hand, an improperly positioned electronic card may cause an unstable electrical connection between the electronic card and the electronic device, so as to shut down the mobile phone or electronic device or even damage the electronic card. As such, there is a need to improve the conventional card connector addressing to the above-mentioned difficulties.

SUMMARY OF THE INVENTION

Accordingly, the present invention is directed to card connector, which is capable of detecting whether an electronic card is inserted and slides to a certain position.

The present invention further provides a card connector including an electronic card detecting device, which is adapted for a conventional electronic card ejecting mechanism.

The present invention provides a card connector. The card connector includes a base, a housing, a terminal set, a first detecting conductive element, and a slidable unit. The base is adapted for assembling to a circuit board. The base includes a slide guiding slot. The slide guiding slot extends substantially along a direction which the electronic card is adapted for insertion. The housing is disposed on the base, and defines a receiving space with the base. The housing is made of a metallic conductive material and is electrically coupled to the circuit board. The terminal set is secured to a certain position of the base. The terminal set includes a plurality of terminals, each of which has an end exposed in the receiving space, and has another end electrically connected to the circuit board. The first detecting conductive element is engaged to the base, and has an end electrically connected to the circuit board. The foregoing slidable unit is adapted to slide along the slide guiding slot. The slidable unit further includes a sliding block and a second detecting conductive element. The sliding block is secured in the slide guiding slot of the base and is adapted for sliding guided by the slide guiding slot. The sliding block has a protrusion projected from the slide guiding slot and extending toward the receiving space. The second detecting conductive element is engaged in the sliding block. The second detecting conductive element includes a first contact portion exposing from the sliding block and being in contact with the housing. The first detecting conductive element is positioned on a moving path of the second detecting conductive element.

When an electronic card is inserted into the foregoing receiving space and driving the slidable unit to move, the second detective element moves together with the slidable unit, so as to electrically contact the first conductive element at least in a certain instance. As such, the second conductive element electrically contacts a circuit which is electrically connected to the first conductive element at least in the certain instance. The instance when the first conductive element and the second conductive element are electrically connected to each other is determined by the position where the first conductive element and the second conductive element are electrically connected to each other as designed. According to an embodiment of the invention, the instance when the first conductive element and the second conductive element are electrically connected to each other is preferred to occur when or after the electronic card is confirmed as reaching to the desired position. A length of the instance of connection between the first conductive element and the second conductive element can be controlled by the designer with many variable approaches, for example but not limited to adjusting lengths or contact angles of the first conductive element and the second conductive element respectively.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
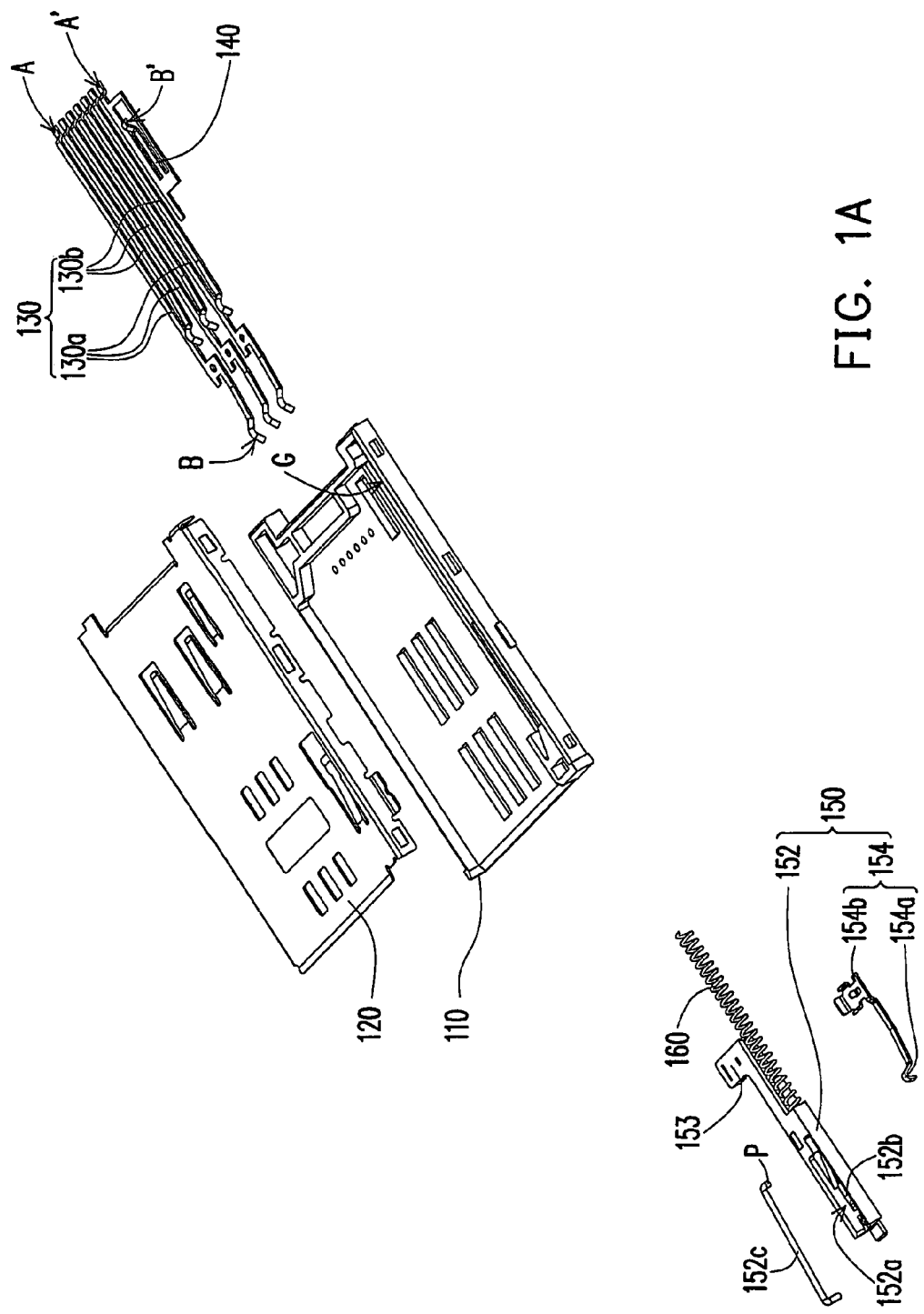
FIG. 1A is an exploded view of a card connector according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
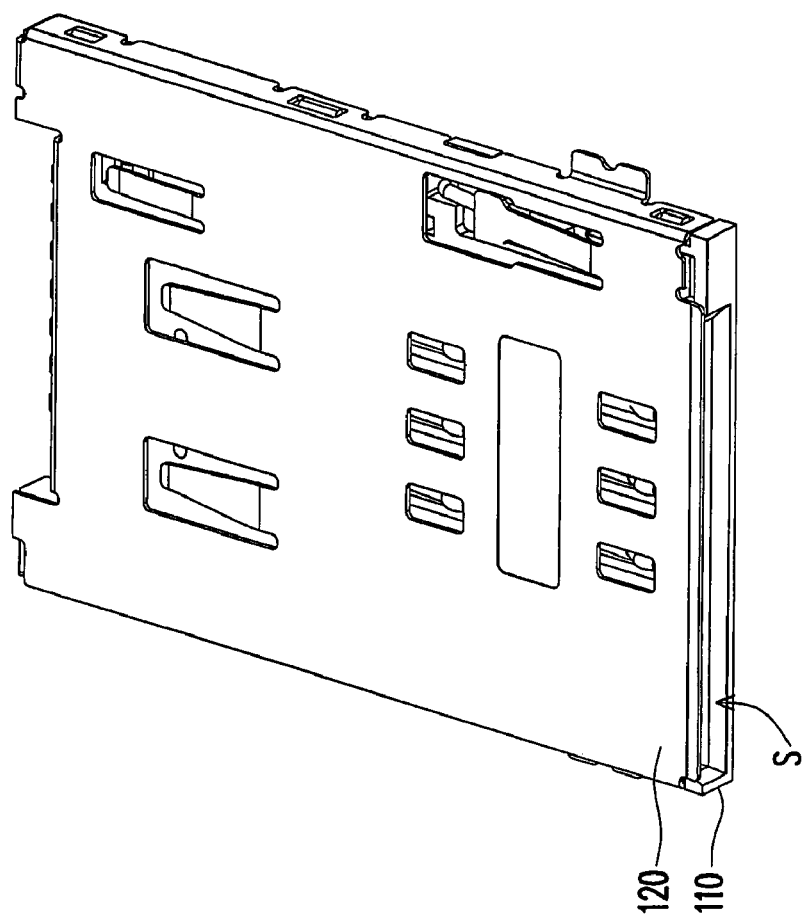
FIG. 1B is a schematic view of an assembled card connector according to an embodiment of the present invention.

FIG. 1A is an exploded view of a card connector according to an embodiment of the present invention. FIG. 1B is a schematic view of an assembled card connector according to an embodiment of the present invention. Referring to FIGS. 1A and 1B, the card connector 100 according to the embodiment of the present invention includes a base 110, a housing 120, a terminal set 130, a first detecting conductive element 140, a slidable unit 150, and an elastic member 160. According to an aspect of the invention, as shown in FIG. 1A, the terminal set 130 is illustrated as including six terminals. However, in other embodiments, the terminal set 130 may include more or less than six terminals as needed. As shown in FIG. 1B, the housing 120 is disposed on the base 110, and defines a receiving space S together with the base 110. The receiving space S is adapted for receiving an electronic card inserted therein. The relationship between the electronic card and the receiving space S can be learnt by referring to FIGS. 2A through 2F. The housing 120 is mainly made of a metallic material. The housing 120 is electrically connected to a circuit board. As shown in FIG. 1A, the terminal set 130 includes a plurality of first terminals 130a and a plurality of second terminals 130b. The first terminals and the second terminals are arranged separately. However, those of ordinary skill in the art may rearrange the arrangement of the terminal set 130, such as the quantity, type, or length of the terminals. The terminal set 130, the first detecting conductive element 140, and the slidable unit 150 are adapted for assembling to the base 110 at the same time.

Figure 1C:
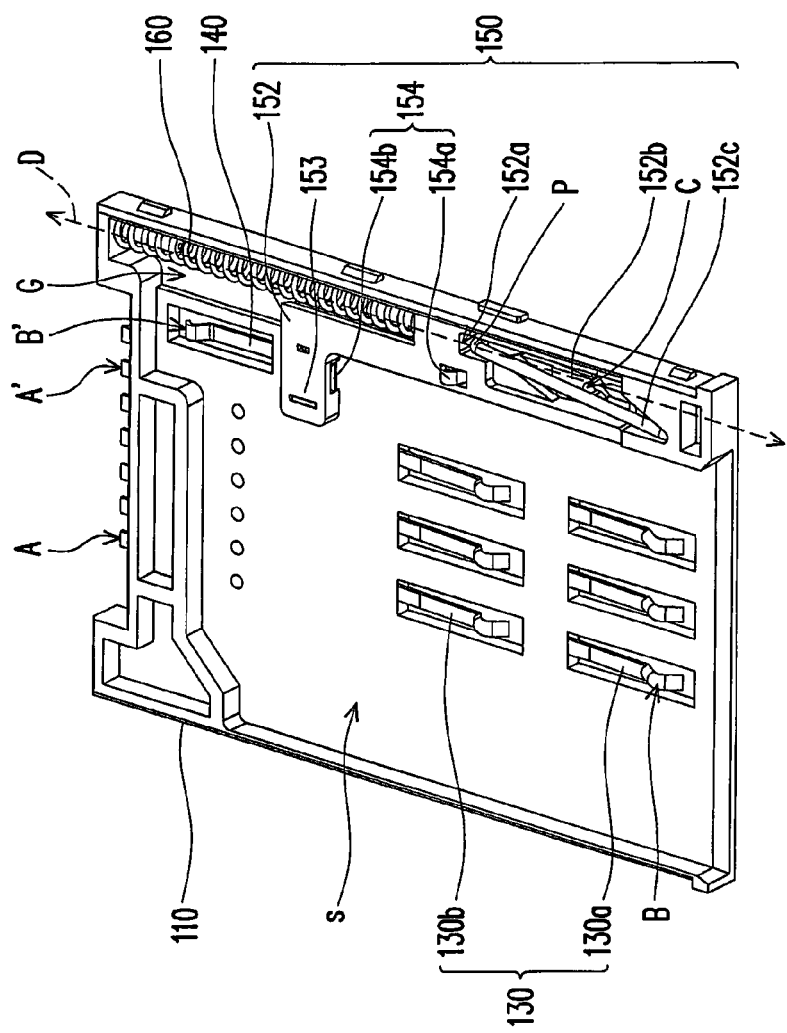
FIG. 1C is a schematic view showing a slidable unit, a terminal set, a first detecting conductive element assembled to a base according to an embodiment of the present invention.

FIG. 1C is a schematic view showing a slidable unit, a terminal set, a first detecting conductive element assembled to a base according to an embodiment of the present invention. Referring to FIGS. 1A and 1C together, according to an aspect of the embodiment, each of the terminals 130a, 130b has an end exposed in the receiving space and another end electrically connected to the circuit board. Taking one of the first terminals 130a as an example, the first terminal 130a includes a welding portion A exposed outside the receiving space S and electrically connected to the circuit board, and a contact portion B exposed in the receiving space S for electrically connecting the electronic card. The electronic card for example is a SIM card. Those skilled in the art may conveniently substitute the aforementioned external circuit board and electronic card or modify the combination thereof as needed.

As shown in FIG. 1C, the first detecting conductive element 140 is engaged in the base 110. Welding portion A' of the first detecting conductive element 140 is exposed outside the receiving space S, and is electrically connected to a circuit (not shown) of the circuit board. Contact portion B' of the first detecting conductive element 140 is exposed in the receiving space S.

As shown in FIGS. 1A and 1C, the base 110 has a slide guiding slot G configured adjacent to the receiving space S. The slidable unit 150 is disposed in the slide guiding slot G, and is adapted for sliding to-and-fro along the slide guiding slot G. The slidable unit 150 includes a sliding block 152 and a second detecting conductive element 154. The second detecting conductive element 154 is embedded in the sliding block 152 and secured thereto. The second detecting conductive element 154 includes a first contact portion 154a and a second contact portion 154b. The first contact portion 154a of the second detecting conductive element 154 is exposed out of the sliding block 152 and is in contact with the housing 120. The second contact portion 154b of the second detecting conductive element 154 can extend out of the slide guiding slot G via a protrusion portion 153 of the sliding block 152. The contact portion B' of the first detecting conductive element 140 extends to a moving path of the second contact portion 154b.

According to an aspect of the embodiment of the present invention, the invention is adapted for a card connector having a double push (or push-push) card ejecting mechanism. As such, the sliding block 152 includes a groove 152a, a stopper portion 152b, and a connection pole 152c. The stopper portion 152b is disposed in the groove 152a, and has a recess C. The connection pole 152c has an end pivoted on the base 110, and has another end having a protrusion post P slidably disposed in the groove 152a. The card connector 100 according to the present invention further includes an elastic member 160 disposed in the slide guiding slot G. The elastic member 160 is a preferably a spring adapted for tension and/or compression. The elastic member 160 is adapted to deform along a direction parallel with direction D as shown in FIG. 1C.

As disclosed above, one end 154a of the second detecting conductive element 154 is in contact with the metal-made housing 120 which is electrically connected to the circuit board, so that when the second detecting conductive element 154 slides to a certain position, it is electrically connected to the first detecting conductive element 140. When the second detecting conductive element 154 electrically connects the first detecting conductive element 140, the first detecting conductive element 140 also electrically connects the housing 120. Further, one end A' of the first detecting conductive element 140 is electrically connected with a circuit of the circuit board, and the housing is also electrically connected to the circuit board. Therefore, the circuit of the circuit board can determine whether the electronic card is positioned in a desired position, and responses accordingly.

According to a preferred embodiment of the present invention, the circuit board inputs an electronic signal from the end A' of the first detecting conductive element 140, and if a same electronic signal is received by the circuit board from the housing 120, it can be concluded that the first detecting conductive element 140 and the second detecting conductive element 54 are in electrical connection, which indicates that the electronic card is in desired position.

Figure 2A:
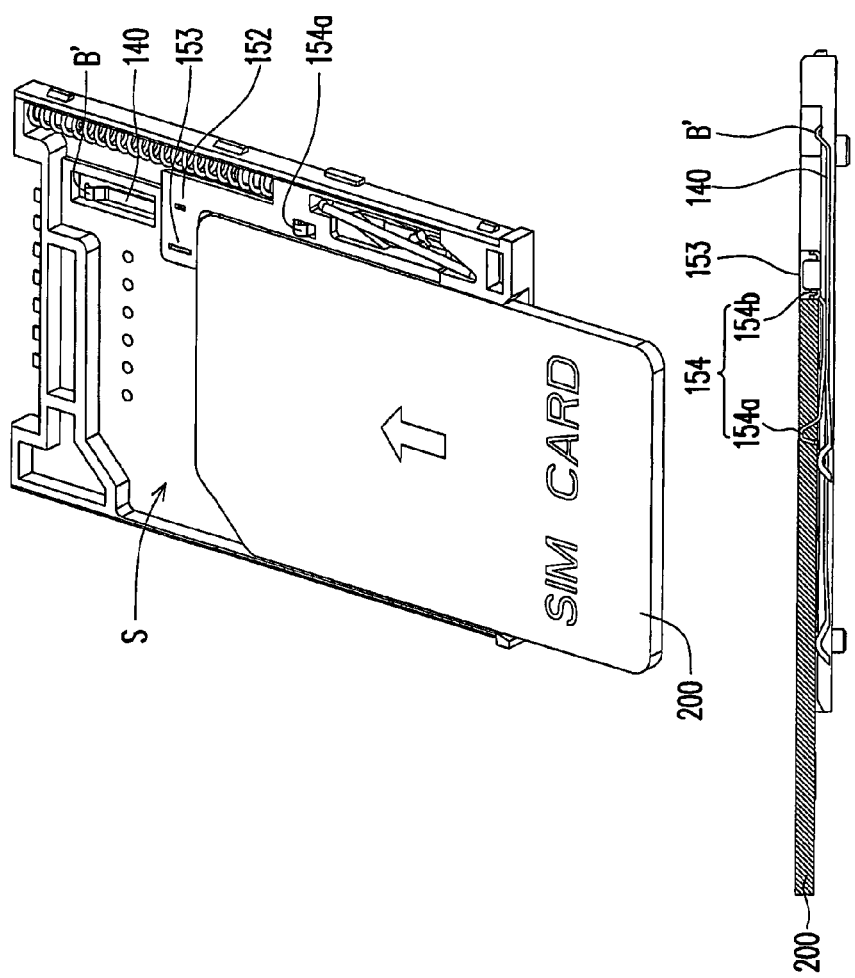
FIGS. 2A through 2F are flow chart illustrating the operation of the card connector according to an embodiment of the present invention.
Figure 2B:
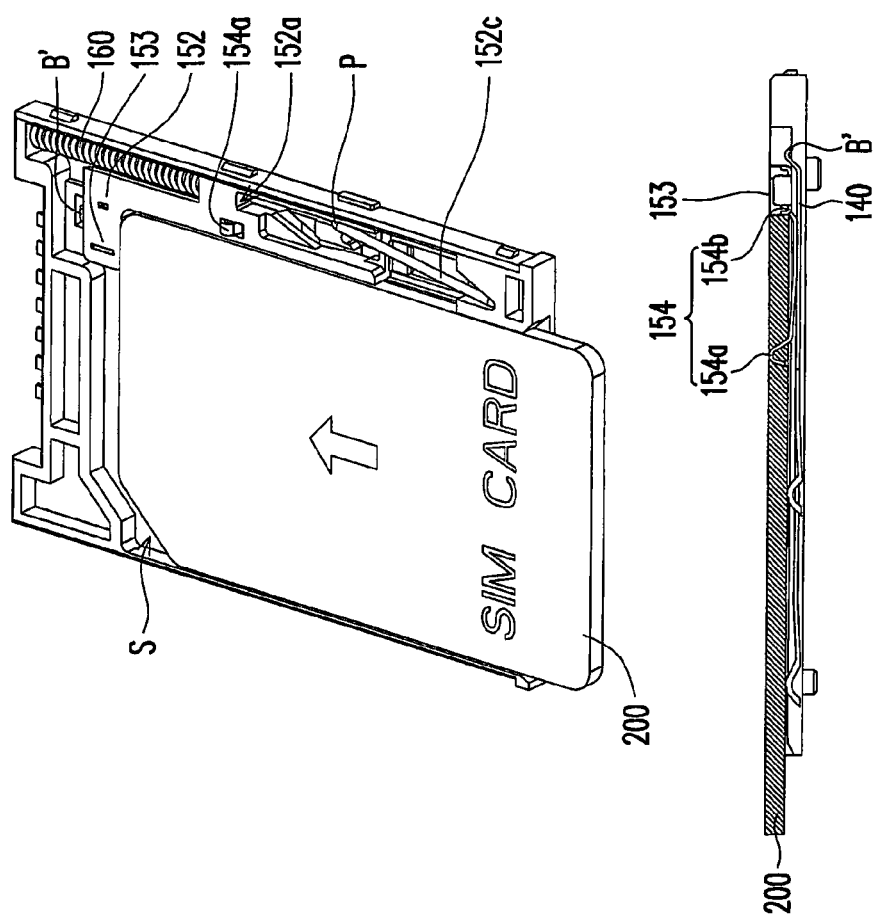

Referring to FIGS. 2A and 2B, when the above disclosed embodiments are incorporated with a double push card ejecting mechanism, in which an electronic card 200 is inserted in the receiving space S, the electronic card 200 drives the protrusion portion 153 of the sliding block 152 to move along a direction substantially parallel with the slide guiding slot G of the base 110. The sliding block 152 then moves together with the second detecting conductive element 154, and the elastic member 160 then elastically deforms.

Figure 2C:
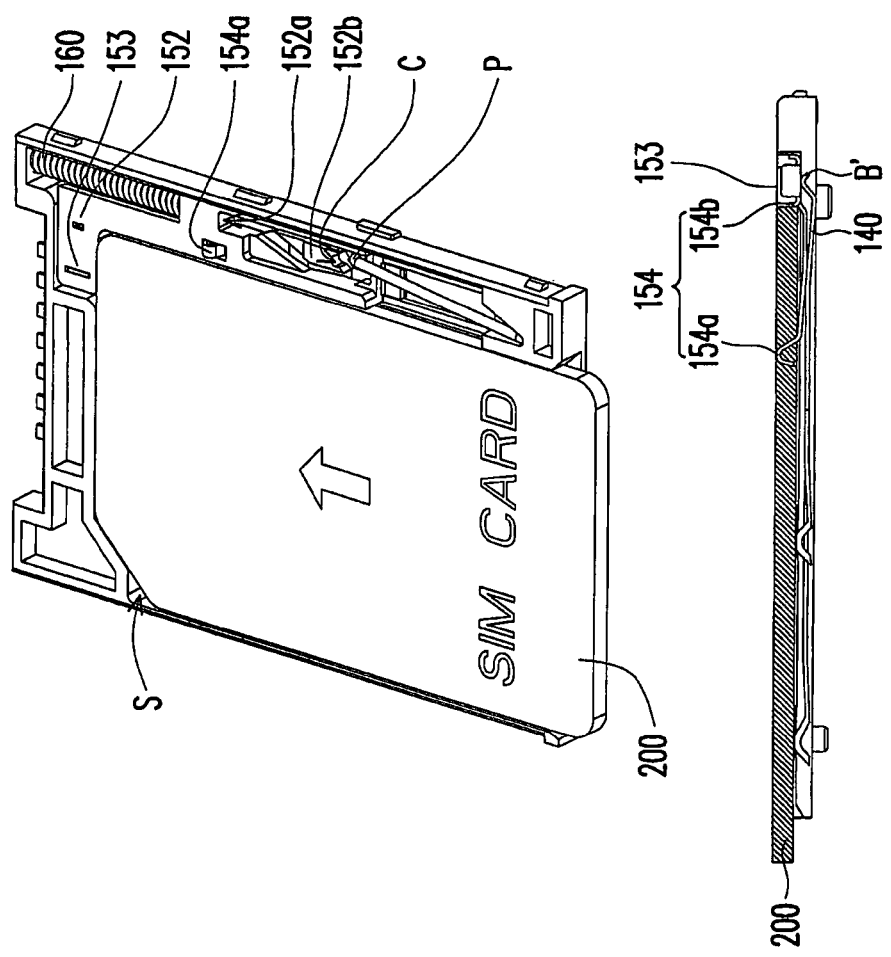

Referring to FIG. 2C, when the protrusion portion 153 of the sliding block 152 moves to a certain position, the protrusion post P of the connection pole 152c is guided by the groove 152a to move in front of the recess C of the stopper portion 152b.

Figure 2D:
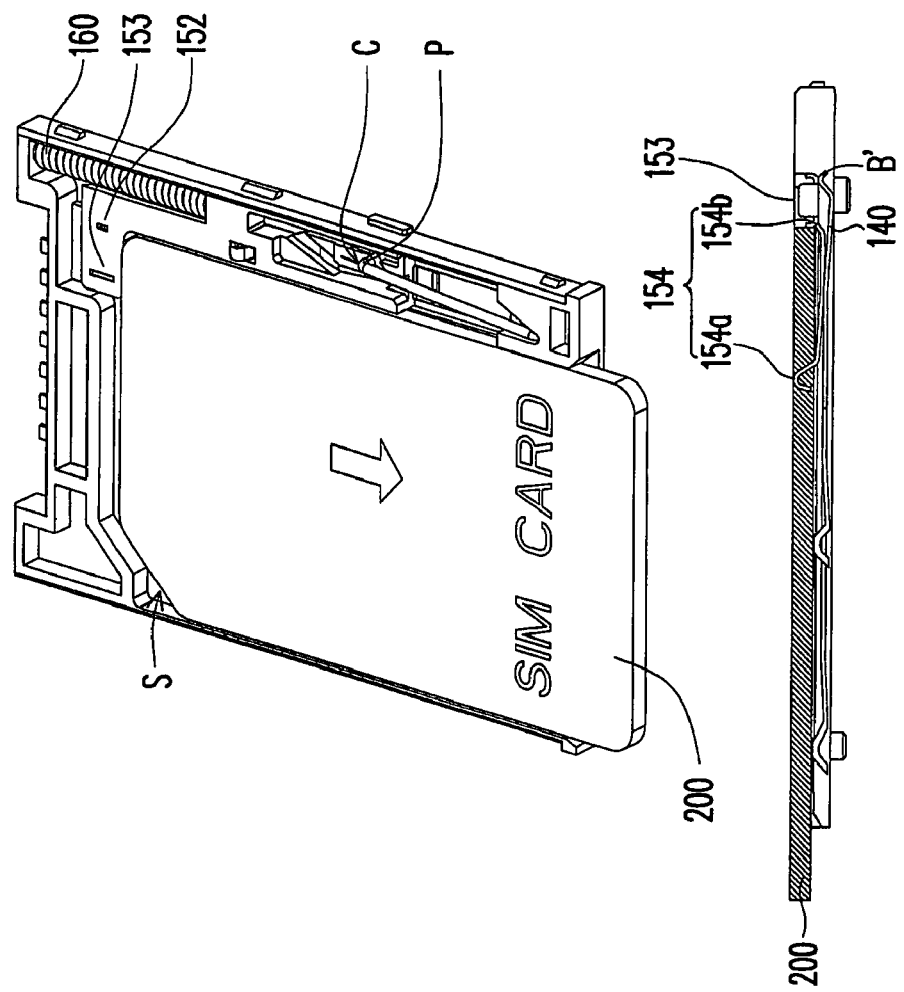

Referring to FIG. 2D, as the elastic member 160 deforms, it applies a recovering force on the sliding block 152 to draw back a certain distance at where the sliding block is locked by the double push ejecting mechanism. As such, the protrusion post P that is originally disposed in front of the recess C is locked on the recess C of the stopper portion 152b due to a spring back motion of the sliding block 152. The sliding block 152 also slides to a certain position.

According to an embodiment of the present invention, the contact portion B' of the first detecting conductive element 140 is disposed on the moving path of the second contact portion 154b of the second detecting conductive element 154. As such, as shown in FIG. 2D, when the electronic card 200 is being positioned, the contact portion B' of the first detecting conductive element 140 will electrically connect the second contact portion 154b of the second detecting conductive element 154. Because the first contact portion 154a of the second detecting conductive element 154 is in contact with the housing 120, a loop is configured by the circuit of the circuit board with the first detecting conductive element 140, the second detecting conductive element 154 and the housing 120, by which the circuit of the circuit board can respond correspondingly to read the electronic card 200. In this manner, the card connector 100 detects whether the electronic card 200 has reached the desired position according to the above disclosed system.

Figure 2E:
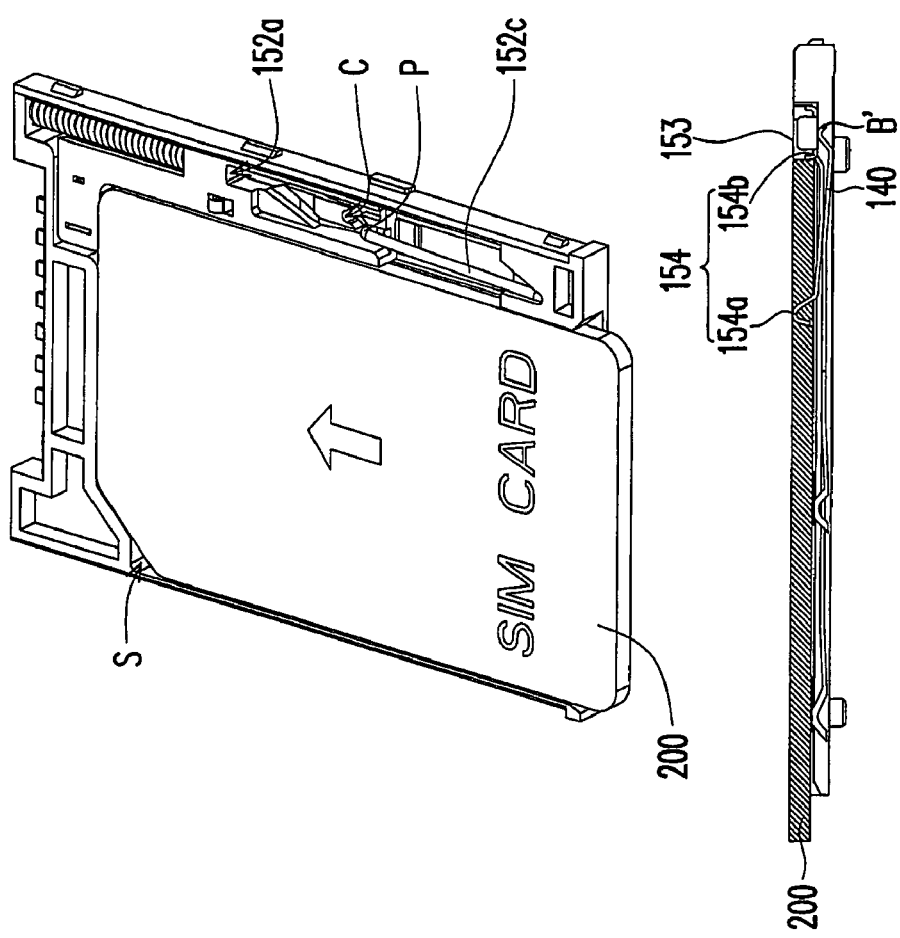
Figure 2F:
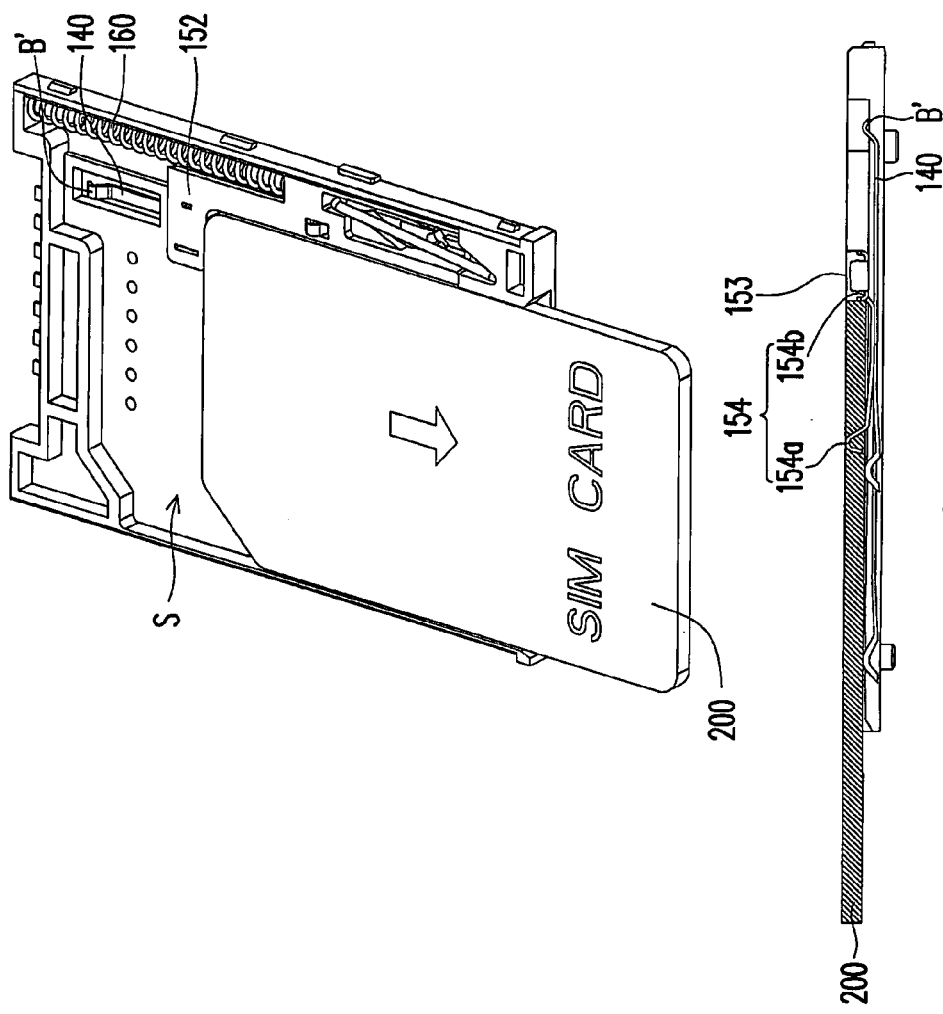

Referring to FIGS. 2E and 2F, when the electronic card 200 is secondly pressed, the protrusion post P of the connection pole 152c slides out from the recess C of the stopper portion 152b guided by the groove 152a, and the sliding block 152 is then driven back to its original status by a recovery force of the deformed elastic member 160. Then the electronic card 200 is pushed by the sliding block 152 out from the receiving space S. As such, the first detecting conductive element 140 and the second detecting conductive element 154 are detached so as to break the electrical connection between the first detecting conductive element 140 and the second detecting conductive element 154. Therefore, it can be learnt by the circuit board that the electronic card 200 has been ejected from the card connector 100.

According to an embodiment of the present invention, the second detecting conductive element 154 moves together with the sliding block 152 so as to at least at a certain instance electrically contact the first detecting conductive element 140. Therefore, the circuit of the circuit board is electrically connected with the first detecting conductive element 140 is also electrically connected to the second detecting conductive element 154 at the certain instance. According to an aspect of the embodiment, the certain instance is preferred to occur when or after the electronic card 200 is confirmed as reaching to its desired position, which indicates a stable electrical connection between the terminal set 130 and the electronic card 200.

According to an embodiment of the present invention, a length of the instance of connection between the first conductive element 140 and the second conductive element 154 can be controlled by the designer in modifying or controlling the first conductive element 140 and the second conductive element 154. For example but not limited to, as shown in FIGS. 2A through 2F, when the first conductive element 140 and the second conductive element 154 are electrically connected to each other, the second detecting conductive element 154 compels the first detecting conductive element 140 to bend downwardly, so that the second detecting conductive element 154 maintains in pressing the first detecting conductive element 140. In such a way, when the first detecting conductive element 140, the second detecting conductive element 154 and the sliding block 152 moves in substantially parallel directions, the first detecting conductive element 140, the second detecting conductive element 154 are maintained in electrical connection to move a relative long distance and for a relative long time. Of course, if a spring member is disposed corresponding to where the two detecting conductive elements are to be electrically connected and extending downwardly from the housing 120, it enforces the pressure of the second detecting conductive element 154 applied to the first detecting conductive element 140.

According to an embodiment of the present invention, the second detecting conductive element 154 is secured to the sliding block 152 by interference fit assembling. However, other approaches may be optionally selected by those of ordinary skill in the art according to practical requirements. For example, one may alternatively change the shape of the second detecting conductive element 154 or other conditions thereof and directly configure the second detecting conductive element 154 on the sliding block 152 with an insert molding method.

In summary, the card connector according to the present invention detects whether there is an electronic card inserted and sliding to a desired position so as to avoid the electronic card being improperly read. Further, when the electronic card is ejected, the foregoing circuit is then shut off. Therefore, the card connector 100 according to the present invention can also automatically detect a card ejection operation therefrom.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A card connector, comprising:
   a base, having a slide guiding slot extending substantially along a direction of an electronic card inserted, and the base being secured on a circuit board;
   a housing, disposed on the base, being a conductive material and electrically coupled to the circuit board, wherein the housing and the base define a receiving space for receiving an electronic card;
   a terminal set, engaged to the base, having a plurality of terminals, each of which has both ends, one exposed in the receiving space and the other electrically connected to the circuit board;
   a first detecting conductive element, disposed on the base, having an end to connect to the circuit board; and
   a slidable unit, disposed in the slide guiding slot and slidable therein comprising:
   a sliding block, mainly secured in the slide guiding slot of the base and slidable therein, wherein the sliding block comprises a protrusion projecting toward the receiving space; and
   a second detecting conductive element, secured in the sliding block, comprising a first contact portion in contact with the housing;
   wherein at least a portion of the first detecting conductive element is positioned in a moving path of the second detecting conductive element to establish an electrical connection with the second detecting conductive element when the second detecting conductive element slides with the sliding block.

2. The card connector according to claim 1, wherein the second detecting conductive element further comprises a second contact portion positioned substantially higher than the first detecting conductive element, so that when the sliding block slides, the second contact portion of the second detecting conductive element downwardly presses the first detecting conductive element.

3. The card connector according to claim 1, wherein the second detecting conductive element is configured on the sliding block by an insert molding process, and the first contact portion of the second detecting conductive element protrudes out from the sliding block so that electrically connects with the housing.

4. The card connector according to claim 1, wherein the second detecting conductive element is configured on the sliding block by interference fit assembling, and the first contact portion of the second detecting conductive element protrudes out from the sliding block so that electrically contacts with the housing.

5. The card connector according to claim 1, wherein the first detecting conductive element and the second detecting conductive element are electrically connected with each other only after the electronic card electrically connects to the terminals of the terminal set.

6. The card connector according to claim 1, wherein the housing further comprises a spring member disposed corresponding to where the two detecting conductive elements are to be electrically connected, the spring member being adapted for pressing the sliding block so as to maintain a stable electrical connection between the first detecting conductive element of the base and the second detecting conductive element of the sliding block.

7. The card connector according to claim 1, wherein the first detecting conductive element and the second detecting conductive element are electrically connected with each other after the electronic card is electrically connected to the terminal set.

* * * * *